United States Patent [19]

Manning et al.

[11] Patent Number: 5,334,862
[45] Date of Patent: Aug. 2, 1994

[54] THIN FILM TRANSISTOR (TFT) LOADS FORMED IN RECESSED PLUGS

[75] Inventors: Monte Manning, Kuna; Charles H. Dennison, Boise, both of Id.

[73] Assignee: Micron Semiconductor, Inc., Boise, Id.

[21] Appl. No.: 104,523

[22] Filed: Aug. 10, 1993

[51] Int. Cl.$^5$ .................... H01L 29/68; H01L 21/265
[52] U.S. Cl. ........................................ 257/67; 257/330; 257/332; 257/333; 257/347; 257/377; 257/903; 437/40; 437/90; 437/109; 437/189; 437/193; 437/203; 437/915
[58] Field of Search ................ 257/67, 330, 332, 333, 257/347, 377, 903; 437/40, 90, 109, 189, 193, 203, 915

[56] References Cited

U.S. PATENT DOCUMENTS 5,298,780 3/1994 Harada .............................. 257/332

Primary Examiner—Edward Wojciechowicz
Attorney, Agent, or Firm—David J. Paul

[57] ABSTRACT

The invention is directed to a thin film transistor (TFT) fabricated by using a recessed planarized poly plug as the bottom gate and a recessed planarized poly plug for the TFT drain connecting region. The TFT of the present invention can be used in any integrated circuit that uses such devices and in particular as a pullup device in a static random access memory (SRAM). The invention is directed to a process to fabricate a thin film transistor (TFT) having LDDs and/or high resistive regions (loads) that are self-aligned to a recessed plug that is used as the bottom gate for the TFT. The thin film transistor (TFT) of the present invention fabricated on a supporting substrate, with the TFT comprising: a recessed conductive plug serving as a control gate; a control gate insulating layer; a non-recessed conductive plug serving as a source/drain region interconnect; a film of semiconductive material connecting to and overlapping the plugs, the film having vertical regions extending above the recessed plug and horizontal regions extending over the recessed and non-recessed plugs; wherein, the vertical regions above the recessed plug are conductively doped to form TFT source/drain regions and the horizontal region spanning between the vertical regions above the recessed plug is conductively doped to form a TFT channel region, the horizontal region above the non-recessed plug is conductively doped to form a TFT source/drain interconnect.

36 Claims, 6 Drawing Sheets

THIN FILM TRANSISTOR (TFT) LOADS FORMED IN RECESSED PLUGS

CROSS REFERENCE TO A RELATED APPLICATION

This application is related to a U.S. patent application Ser. No. 061,402, filed May 12, 1992.

FIELD OF THE INVENTION

This invention relates to semiconductor devices and more particularly to a thin film transistor structure and a process to create same. The thin film transistor structure can be used as an active load in integrated circuit devices, such as Static Random Access Memories (SRAMs).

BACKGROUND OF THE INVENTION

One of the common elements required in electrical circuit devices is the simple pullup (or pulldown device) from an active device to one of the power supply buses. The pullup is simple if used to construct a circuit using discrete components, in that, all that is required is selecting a resistor of the desired resistance and tolerance, connecting it between an active device, such as an n-channel MOS transistor, and $V_{cc}$ and the transistor's output would be pulled up to $V_{cc}$ once the transistor is turned off. With the advent of the integrated circuit (IC) however, fabricating a resistance onto a wafer substrate, such as silicon or gallium arsenide, takes special consideration particularly when resistivity and tolerances play an important part in circuit operation.

For example, as SRAMs have evolved from the small 4 Kb memory arrays to more densely packed array sizes, tolerances of pullup resistances (or pullup loads) had to be tightly controlled. In order to minimize standby current many fabrication processes adopted using an active device as the pullup. In CMOS fabrication it is common to see a PMOS transistor acting as an active load device by providing a current path between a memory cell pulldown transistor and the power supply bus. In this manner the PMOS transistor could be gated on only when the desired line was to be pulled to $V_{cc}$ and turned off otherwise, thereby virtually eliminating leakage current and minimizing standby current for the SRAM device as a whole.

A problem with TFTs is high off-current due to high electric fields between the channel and drain region of the TFT. To reduce this off current, one can offset the drain from the edge of the gate such that a region of low doped or undoped, non-gated TFT poly lies between the gated channel and the TFT drain. Since many TFTs are bottom gated, a photo step defines the location of the drain, and is therefore susceptible to misalignment. The size of the offset region has a large impact on the TFT device performance.

Ongoing efforts to improve active loads has brought about the development of thin film transistors (TFTs) in attempts to provide low leakage current as well as high noise immunity. The following two articles, hereby incorporated by reference, discuss TFT development in SRAMs. The first article is "A POLYSILICON TRANSISTOR TECHNOLOGY FOR LARGE CAPACITY SRAMs," by Ikeda et al., IEDM 1990, pp. 469–472. The second article is "A 25 $\mu m^2$, New Poly-Si PMOS Load (PPL) SRAM Cell Having Excellent Soft Error Immunity," by Yamanaka et al., IEDM 1988, pp. 48–51.

The present invention, however, introduces a TFT that has lightly doped drain regions (LDDs) and/or high resistive regions (loads) that are self-aligned to a recessed TFT gate. This invention provides self-aligned offset regions or high resistance regions to lower the off current of the TFTs without additional photo steps. In fact fewer masking steps are required.

SUMMARY OF THE INVENTION

The invention is directed to a process to fabricate a thin film transistor (TFT) having LDDs and/or high resistive regions (loads) that are self-aligned to a recessed plug that is used as the bottom gate for a TFT. A TFT is realized by a process which comprises:

forming a patterned insulative layer overlying a starting substrate such that openings in the patterned insulative layer expose first and second conductive lines, the first and second conductive lines comprising a conductive material which is covered with overlying insulative material;

forming recessed conductive material in the openings thereby forming first and second recessed conductive plugs;

forming a patterned gate insulating layer overlying and conforming to the first conductive plug, the patterned gate insulating layer having openings to expose the second recessed conductive plug;

forming a patterned semiconductive film overlying and conforming to the patterned gate insulating layer and the conductive plugs;

introducing conductive impurities into the semiconductive material at an angle to form TFT source/drain regions in the substantially vertical walls of the semiconductive material at the first conductive plug and to form a TFT channel region in the substantially horizontal portion of the semiconductive material that overlies the first conductive plug, the first conductive plug functioning as a TFT control gate; and introducing conductive impurities into the semiconductive material that extends from the first conductive plug and overlies and connects to the second conductive plug to form a TFT source/drain connection region.

DETAILED DESCRIPTION OF THE INVENTION

A preferred embodiment of the present invention is directed to a process for fabricating a thin film transistor that can be used in a variety of integrated circuits (ICs) and in particular as an active PMOS TFT pullup with a self-aligned LDD and/or a high resistive load resistance. Such a device can be used as the load for a cross-coupled inverter, whereby the cross-coupled inverter can specifically be used as an SRAM cell. FIGS. 1–3a depict the preferred embodiment of the present invention while other embodiments are represented in FIGS. 3b and 3c. FIGS. 4 and 5 depict another alternate embodiment to form a TFT self-aligned LDD also having a low resistive exhumed contact between the TFT poly and a planarized poly plug that serves as the drain terminal for the TFT. The process steps of FIGS. 1–5 are described as integrated into an SRAM cell to serve as an example. As one skilled in the art will appreciate from the following discussion, the TFT having a self-aligned LDD can be integrated into any fabrication process for an integrated circuit that can utilize such a structure.

Figure 1:
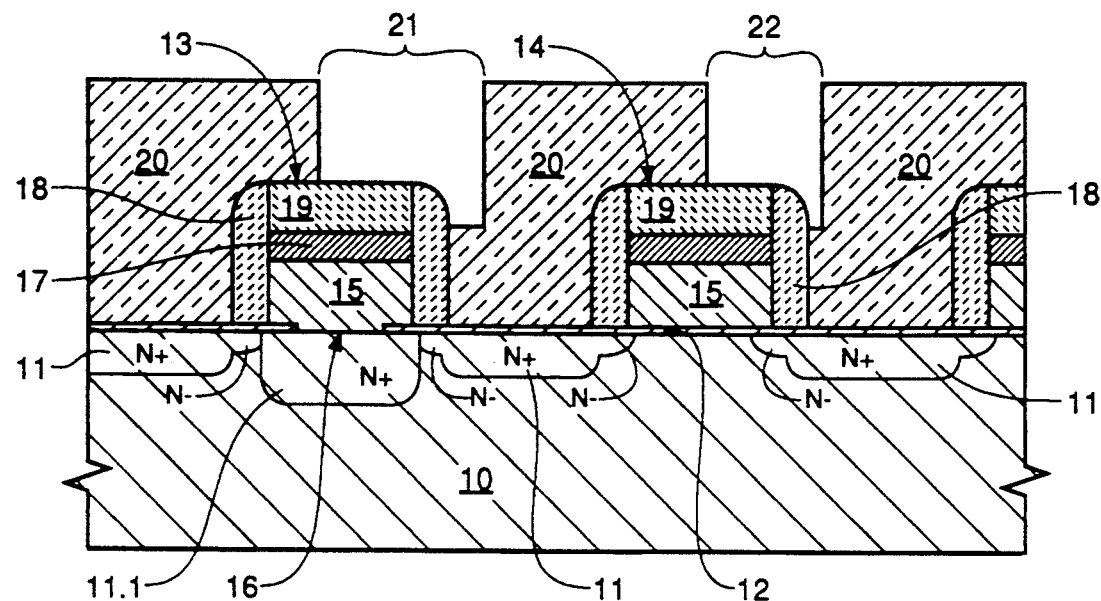
FIG. 1 is a composite cross-sectional view of an in-process wafer portion depicting a patterning step for defining a future TFT location.

Referring now to FIG. 1, a starting silicon substrate 10, having diffusion areas 11 (n-type doping) therein, is fabricated using conventional process steps, known to one skilled in the art. TFT gate coupling line 13 and 14 are formed from a patterned stacked layer, such as nitride 19, silicide 17 and polysilicon layer 15 which are all patterned at the same time with the same photo and etch step. Coupling line 13 makes contact to a diffused buried contact region 11.1 at buried contact 16, while coupling line 14 overlies gate oxide 12 (coupling line 14 will be used to form a gate to a pulldown transistor in the SRAM cell). Coupling lines 13 and 14 (from patterned polysilicon layer 15) are overlaid with an optional tungsten silicide layer 17 (thus forming a poly/silicide stack, 15 and 17) and a patterned insulating layer 19 of nitride overlies silicide layer 17. Insulating spacers 18 (nitride, oxide, TaO$_5$ or other suitable insulating materials) cover the patterned edges of coupling lines 13 and 14. Next, a thick insulating layer 20 is planarized and patterned thereby providing access to insulating layer 19 and insulating spacers 18 which overlie and are adjacent to coupling lines 13 and 14. An optional insulating layer can be formed prior to the patterning of planarized layer 20 if it is necessary to have as a diffusion blocking layer to prevent dopant impurities from diffusing into the future overlying TFT channel. For example, this optional layer would be needed if planarized insulating layer 20 was BPSG (borophosphosilicate glass) as the optional layer would prevent the dopants of boron and phosphorus, inherent in the BPSG layer, from diffusing into the future overlying TFT channel.

Figure 2:
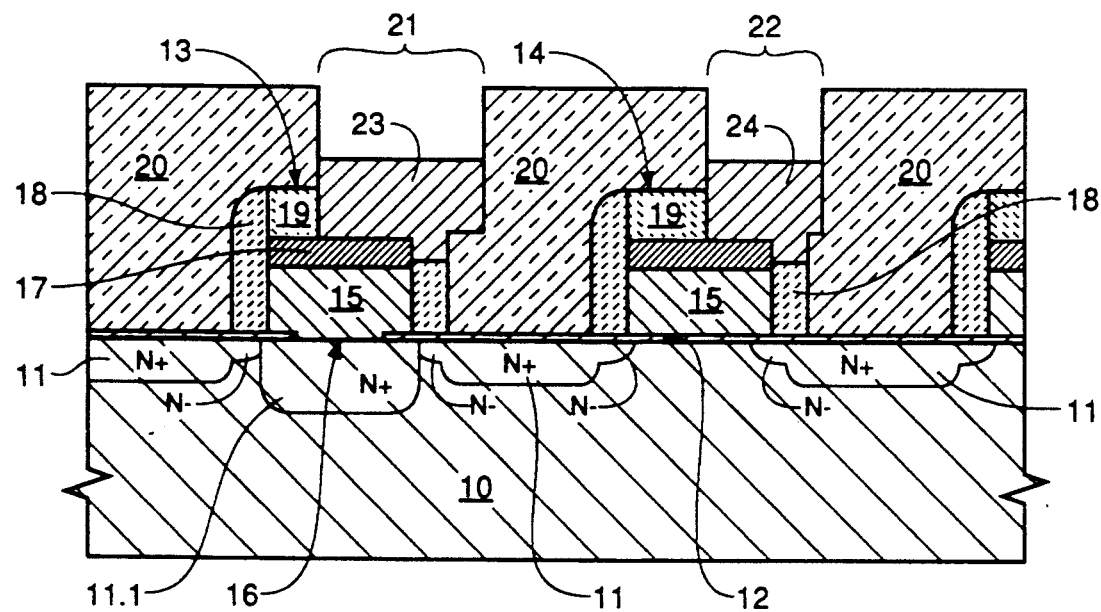
FIG. 2 is a composite cross-sectional view of the in-process wafer portion of FIG. 1 depicting formation of recessed plugs.

Referring now to FIG. 2, insulating layers 19 and 20 and a portion of insulating spacers 18 are removed to open future TFT gate region 21 and TFT drain region 22. The critical aspect is to not etch down to the diffusion area 11 (also defined as the active area 11 by the presence of gate oxide 12) so that the openings for regions 21 and 22 are not required to be surrounded by polysilicon 15 to act as an etch stop. Nitride layer 19 increases the process margin of the etch step that forms plug openings 21 and 22. The first part of the etch uses a chemistry that removes oxide 20 selectively without removing nitride 19 and 18. The last part of the etch then switches to a chemistry that removes nitride 19 and 18, selectively, without removing oxide 20. The thickness of oxide 20 overlying nitride 19 (after planarization) may be variable. It is important that the plug opening etch does not etch all the way down to diffusion regions 11. This process allows the etch more process window by stopping the oxide etch at an earlier point than would be possible without the nitride layer 19.

However, it is possible to form the correct structure with adequate process margin without the nitride layer 19. To do this, the poly layer 15 would need to be thicker such that the plug opening etch could open the top of the coupling lines 13 and 14 but not etch down to the diffusion regions 11 (where the openings 21 and 22 overhang the coupling lines 13 and 14).

Regardless of which plug opening etch method is used an n-type doped polysilicon layer is then formed (preferably in situ doped n-type during the poly deposition) and planarized, using such methods as chemical mechanical polishing (CMP), to isolate the poly filled regions 21 and 22 and form a TFT poly gate 23 and a TFT drain interconnecting poly plug 24. Interconnect 24 will be used for electrical coupling between the gate of a pulldown device and the drain of a future TFT. The planarized poly plugs 23 and 24 are then recessed below the upper surface of planarized layer 20 using a dry or wet selective poly etch process. It is also possible to forgo the planarization of layer 20, thus forming the plug openings 21 and 22 in a non-planarized film. In situ doped poly is then deposited which fills plug openings 21 and 22. Finally, the poly and oxide 20 are planarized together in a single planarization step using a process that etches poly and oxide at the same rate (such as CMP with a silicate slurry). After recessing the plugs as described above, the resulting structure appears as represented in FIG. 2. This eliminates one planarization step.

Figure 3A:
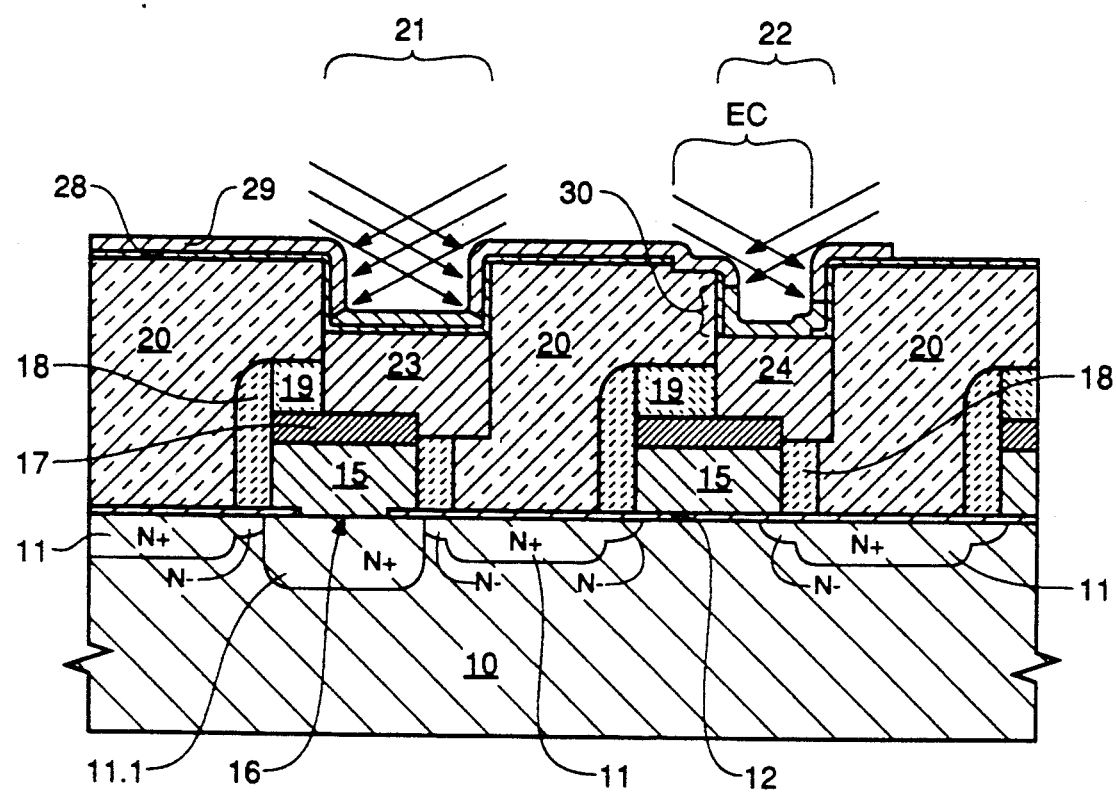
FIG. 3a is a composite cross-sectional view of the in-process wafer portion of FIG. 2 depicting a first embodiment of the present invention.
Figure 3B:
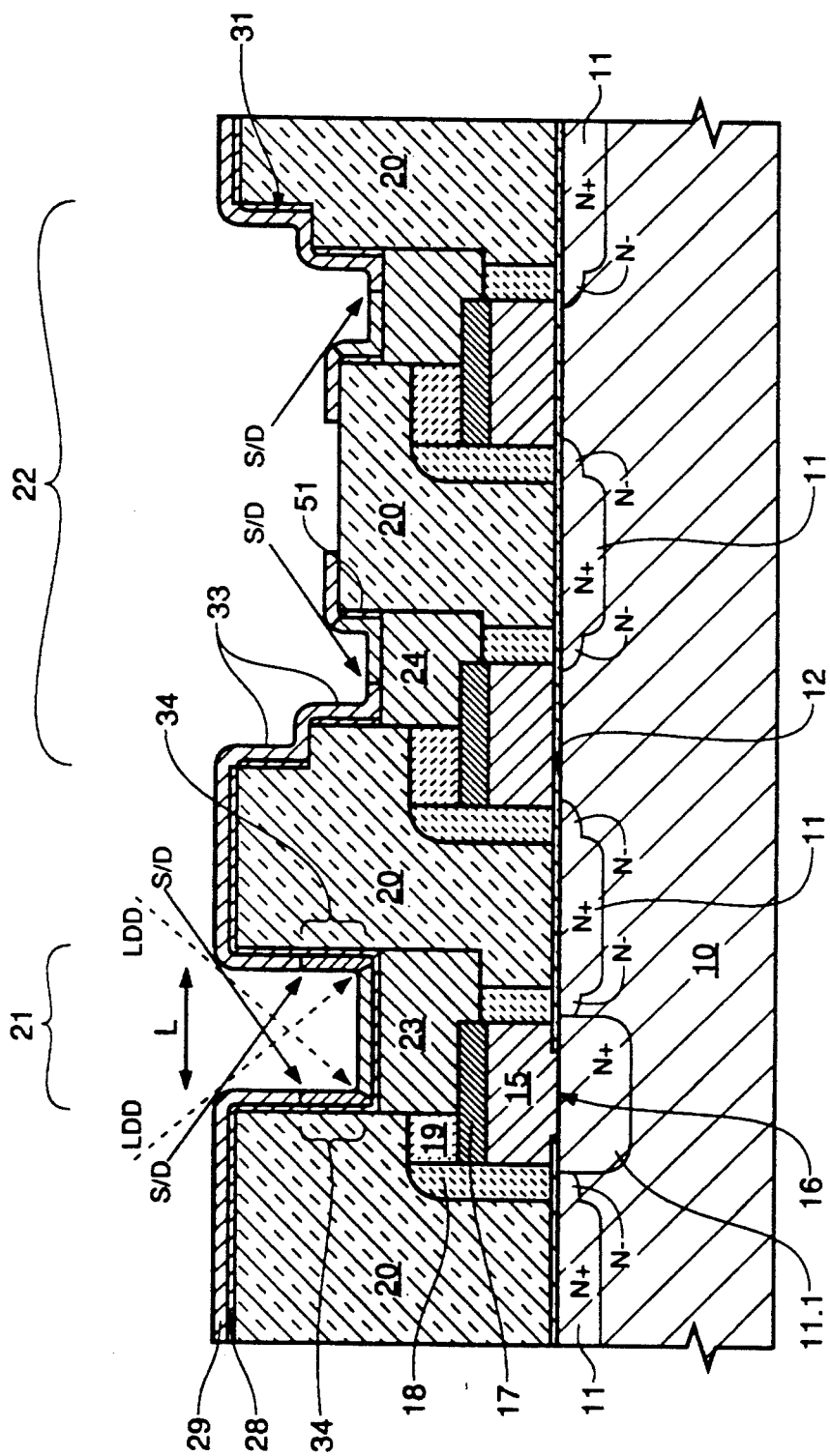
FIG. 3b is a composite cross-sectional view of the in-process wafer portion of FIG. 2 depicting a second embodiment of the present invention.
Figure 3C:
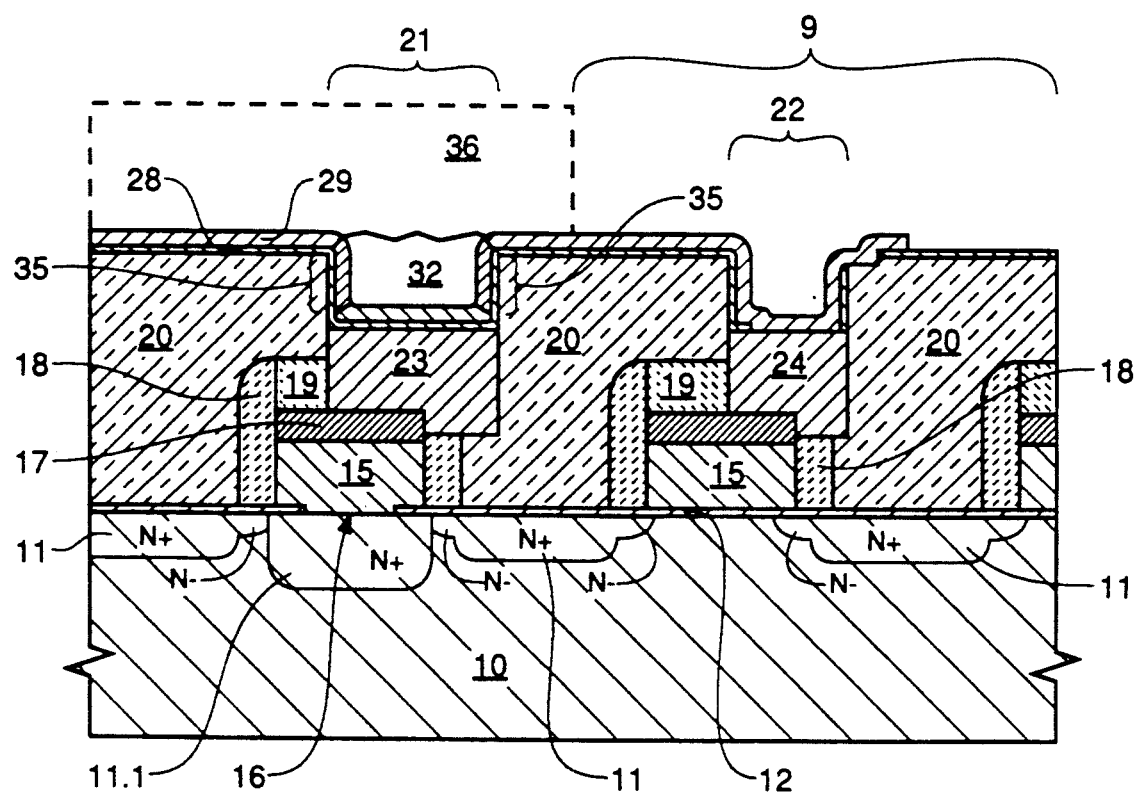
FIG. 3c is a composite cross-sectional view of the in-process wafer portion of FIG. 2 depicting a third embodiment of the present invention.

As a first embodiment and referring now to FIG. 3a, a TFT gate dielectric 28 is deposited over recessed planarized TFT poly gate 23 and the TFT drain interconnecting poly plug 24. Next, an exhumed contact (EC) photo and etch is performed to expose interconnecting poly plug 24 to allow for a conductive interconnect. There is no need for the EC to be completely enclosed by the underlying plug 24 since the oxide 28, to be removed during the EC etch, is much less than that between the top of the plug 24 and the active area 11. Also, the EC need not be overlapped by future TFT poly 29 as the amount of TFT poly 29 etched is much less than the thickness of the poly plug 24, thus preventing the chance of etching into the gate poly 15. Therefore, the only requirement is that TFT poly 29 make sufficient contact to underlying poly plug interconnect 24. Now the wafer is ready for deposition of TFT polysilicon 29 that overlies TFT dielectric 28 and makes connection to a neighboring TFT drain poly plug interconnect 24 through the EC opening in TFT dielectric 28. After TFT poly 29 deposition, angled TFT source/drain (S/D) implants are performed such that there is no offset region between the S/D implanted regions and the TFT poly that is gated by the TFT poly gate 23. Instead, a high-resistance (high-R) region 30 is formed at the drain contact to reduce the electric field at the TFT drain and hence, reduce off current drawn by the TFT.

An alternate embodiment to FIG. 3a, is to orient all the TFTs in the same direction on the wafer and only angle implant in one direction thus shadowing the S/D implant from one vertical side to produce an offset region.

In either case, the n+(or p+if the plug is boron doped) will diffuse to some extent into the TFT poly 29 at the EC and thus reduce high-R region 30 to some degree. Should this occur, the angle of the S/D implant, the size of the EC, or the depth of the recessed plug (surface of dielectric layer 20 to top of the plug 24) can be optimized to provide more high-R at the drain. For example, the opening over the poly plug interconnect 24 is narrower than the opening over the TFT gate poly 23, thus causing the angled implant to be blocked from the high-resistance region 30 by the vertical edges of the opening over the poly interconnect 24. This prevents region 30 from becoming doped and thus resulting in a self-aligned high-R region. This high-R region lowers the electric field at the TFT drain which lowers the TFT off-current. This approach uses no additional masking steps than those used in conventional TFT SRAM processes.

As a second embodiment and referring now to FIG. 3b, following a TFT poly 29 photo and etch, angled TFT LDD (lightly doped drain) p+implants are performed, followed by a higher-angled, higher dose, TFT source/drain (S/D) p+ implant. The LDD dimension is a function of the TFT channel length "L" (in FIG. 3b) and the angles used for the LDD and S/D implants. At the drain contact, the EC etch opens a longer contact area, and the EC etch is deeper such that the high-angled S/D implant may dope the full sidewall of the drain contact 33 and not be blocked by the opposite wall 51 of the TFT drain poly plug 24. Not only is the EC opening deeper, but the recess of the plug poly 23 over the TFT gate is deeper as well, which provides more room for the LDD's to be formed during this implant. The drain poly plug 24 openings are still square and limited to the area over the gate poly. The EC may bridge across two cells to provide the width necessary to allow the high-angled S/D implant to dope the drain plug sidewalls. No shorts occur between the cells both within and outside of the EC as the EC etch does not go down to the substrate nor does the TFT poly need to enclose the EC since the overetch will only etch the drain poly plug 24. This approach uses no additional masking steps than those steps used during conventional TFT SRAM processes and results in self-aligned LDD regions 34 for the TFTs to lower the TFT off current.

As a third embodiment and referring now to FIG. 3c, angled implants are performed to provide TFT LDDs 35. Next photoresist 36 is patterned to uncover the drain region 9 such that all photo resist is removed from plug opening 22, then the remaining patterned resist is planarized (for example, using controlled etching of the photoresist in an oxygen plasma, also referred to as descum) such that all horizontal TFT poly is exposed to the subsequent TFT S/D implant. However, the resist remains in the plug opening 21, that was covered with resist prior to descum, in order to protect the TFT channel and LDD's that were implanted prior to the patterning of resist 36.

Figure 4A:
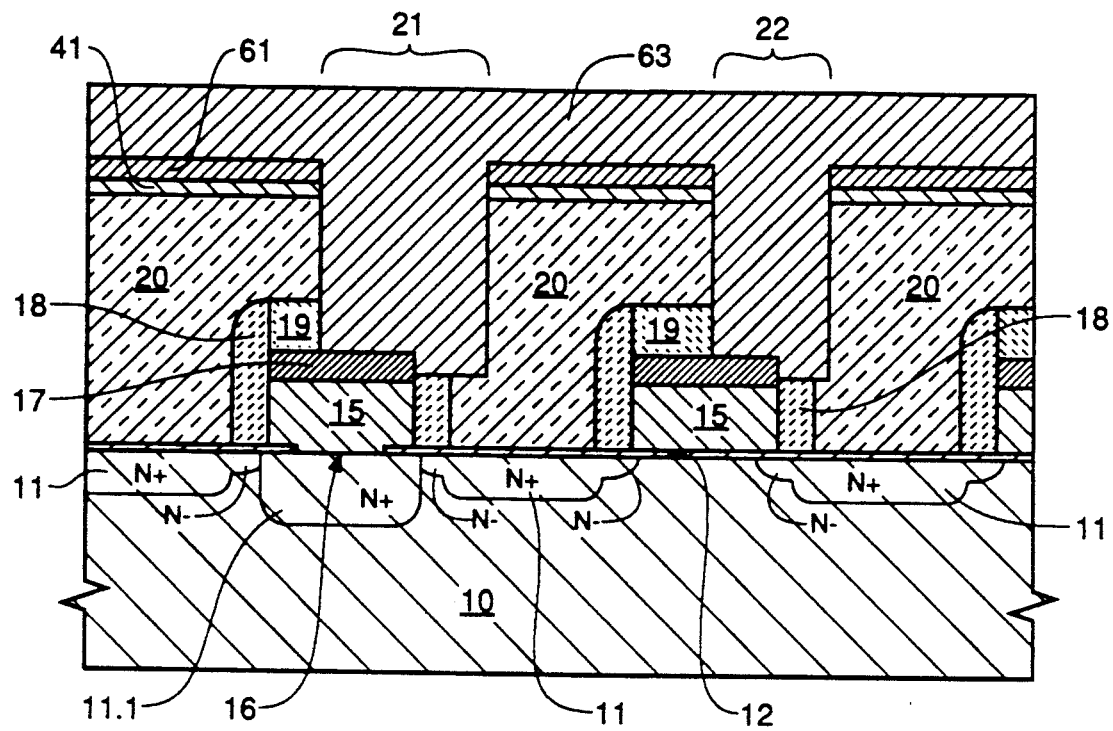
FIGS. 4a–d depict a fourth embodiment of the present invention showing a composite cross-sectional view of an in-process wafer portion depicting formation of a planarized TFT with one a low resistive exhumed contact between the TFT poly and a poly plug used as the TFT drain.

As another alternate embodiment and now referring to FIG. 4a, a layer of p+ poly 41 is deposited after planarization of oxide layer 20 and prior to opening the plug regions 21 and 22. A layer of Si3N4 61 is optionally deposited on top of this p+ poly 41 to ensure uniform p+ poly thickness after poly plug formation. This p+ poly layer 41 will provide a low-resistive poly for TFT source and drain connections to $V_{cc}$, as well as to the self-aligned TFT S/D's formed in the horizontal regions of the TFT poly.

Figure 4B:
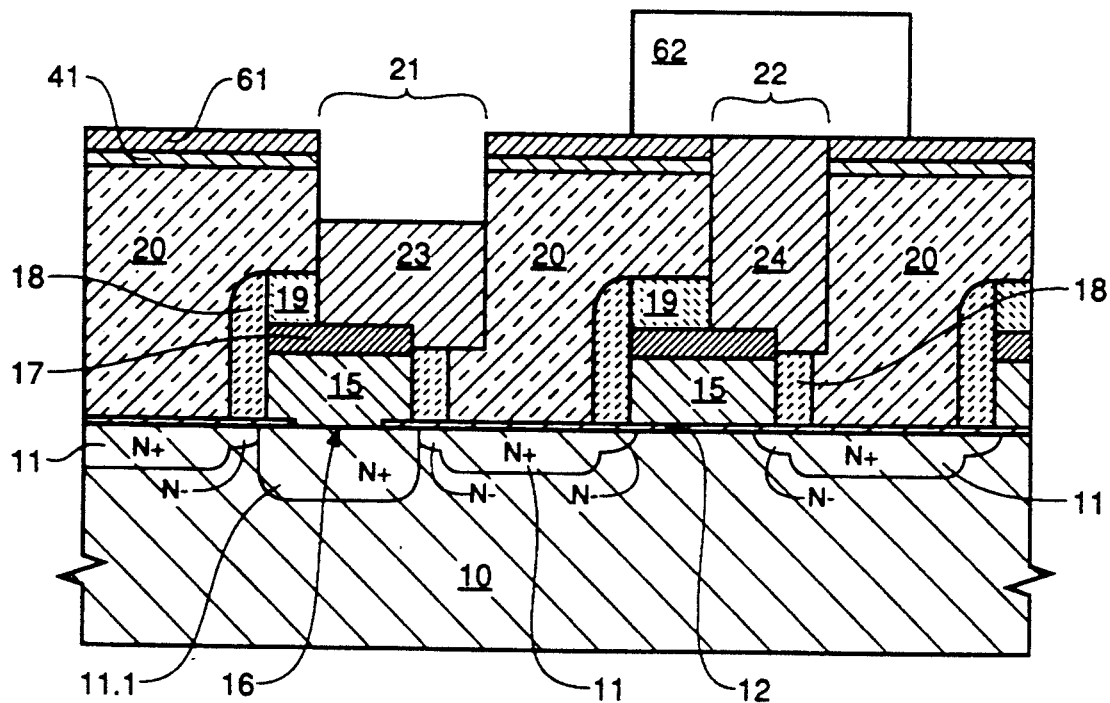

Referring now to FIG. 4b, the poly 63 is planarized using the nitride layer 61 as an etch stop. Masking layer (e.g. photoresist 62) is patterned to cover the TFT drain interconnect plug 24. The TFT gate plug is then recessed, during which time, p+ poly layer 41 is protected by nitride layer 61. Then, nitride layer 61 is removed.

Figure 4C:
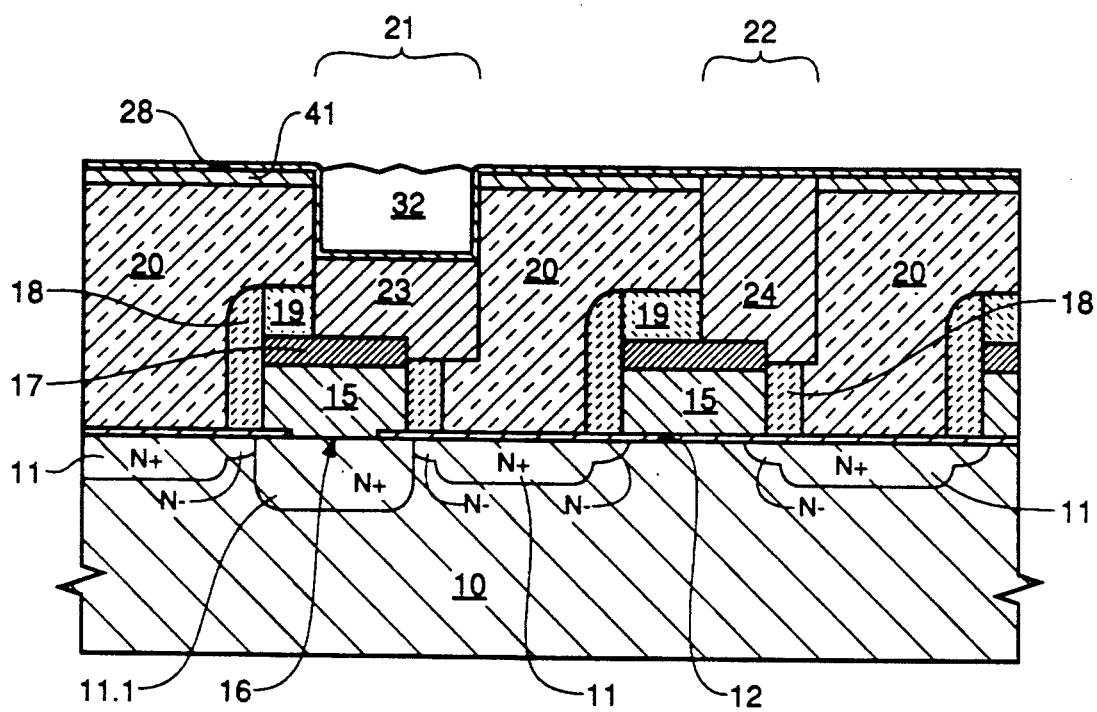

Referring now to FIG. 4c, TFT gate oxide 28 is then deposited and the remaining recess over the TFT gate poly plug 23 is filled with resist 32 in the same way as in FIG. 3c. It is not necessary however to use an additional masking step to select only plug openings for the TFT gate poly 23 since only these regions are recessed. Instead, photo resist may be applied and planarized thus leaving resist in the recessed plugs 23 while uncovering all other regions.

Figure 4D:
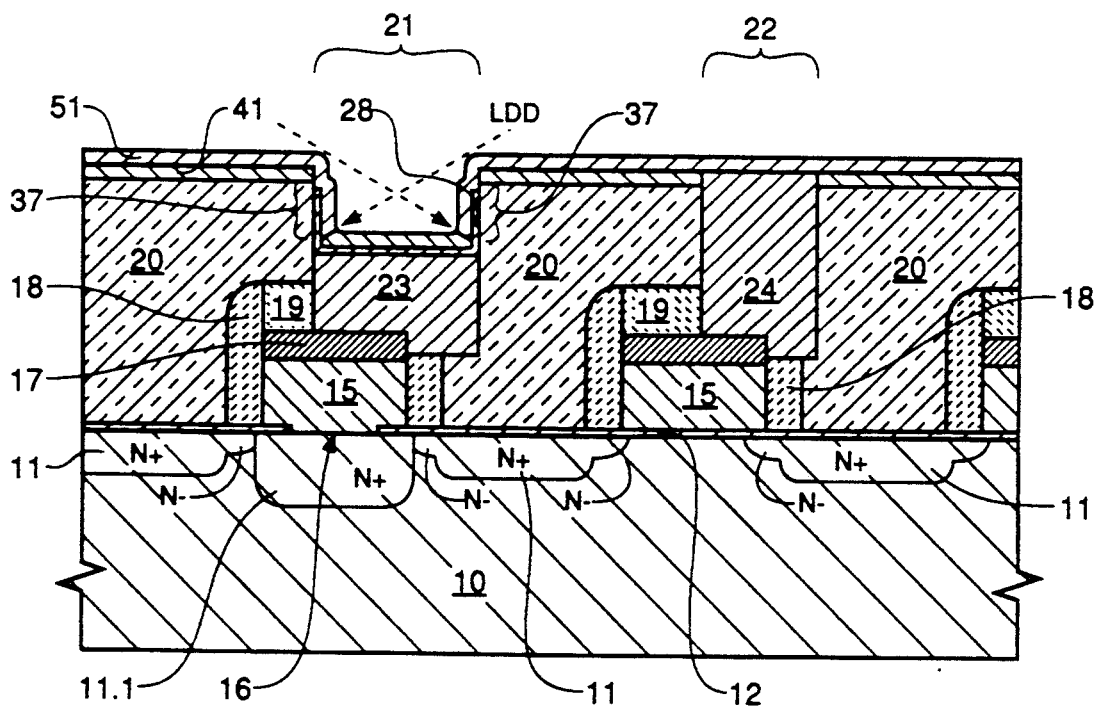

Referring now to FIG. 4d, after the recessed TFT gate region 21 has been back filled with resist 32, the exposed TFT gate oxide 28 is removed. Next, the resist 32 is removed, TFT poly 51 is deposited which is then followed by an angled LDD implant, to form self-aligned LDDs 37. In this embodiment, no S/D implant is required since the horizontal TFT poly will be auto-doped from the p+poly 41. The wafer is then completed using conventional process steps, including at least one thermal step sufficient to electrically activate the TFT p+ source/drain implants. This approach uses no additional masking steps than those steps used during conventional TFT SRAM processes.

As one skilled in the art would readily recognize, the conductivity types selected for doping the substrate and forming the active devices may be reversed to create an NMOS TFT device overlying and aligned to an active PMOS device if so desired. Also, any combination of the embodiments presented can be used.

Therefore, it is to be understood that although the present invention has been described with reference to several embodiments, various modifications, known to those skilled in the art, may be made to the structure and process steps presented herein without departing from the invention as recited in the several claims appended hereto.

What is claimed is:

1. A process for forming a thin film transistor (TFT) fabricated on a supporting substrate, said process comprising:
   a) forming a patterned insulative layer overlying said supporting substrate such that openings in said patterned insulative layer expose first and second conductive lines, said first and second conductive lines comprising a conductive material which is covered with overlying insulative material;
   b) forming planarized recessed conductive material in said openings thereby forming first and second planarized recessed conductive plugs;
   c) forming a patterned gate insulating layer overlying and conforming to said first conductive plug, said patterned gate insulating layer having openings to expose said second recessed conductive plug;
   d) forming a patterned semiconductive film overlying and conforming to said patterned gate insulating layer and said conductive plugs;
   e) introducing first conductive impurities into said semiconductive material at an angle to form TFT source/drain regions in the substantially vertical walls of said semiconductive material at said first conductive plug and to form a TFT channel region in the substantially horizontal portion of said semiconductive material that overlies said first conductive plug, said first conductive plug functioning as a TFT control gate; and f) introducing second conductive impurities into said semiconductive material that extends from said first conductive plug and overlies and connects to said second conductive plug to form a TFT source/drain connection region.

2. The process of claim 1, wherein said patterned insulative layer is planarized.

3. The process of claim 1, wherein said introducing of first and second conductive impurities are performed at the same time with the same implantation step.

4. The process of claim 1, wherein said planarization of said conductive material and patterned insulating layer is performed at the same time.

5. The process of claim 4, wherein said planarization of said conductive material and patterned insulating layer is performed at the same time using chemical mechanical polishing with a silicate slurry.

6. The process of claim 1, wherein said introducing of first and second conductive impurities further comprises:
performing a first angled implant to form lightly doped regions in the vertical portions of said semiconductive film; and
performing a second angled implant to form TFT source/drain regions in said exposed portions of said semiconductive film.

7. The process of claim 6, wherein said second angled implant is performed at a greater angle than said first angled implant.

8. A process for forming a thin film transistor (TFT) fabricated on a supporting substrate, said process comprising:
a) forming a planarized insulative layer overlying said supporting substrate;
b) forming a conductive film overlying said planarized insulative layer;
c) forming an etch stop layer overlying said conductive film;
d) patterning said conductive film, said etch stop layer and said planarized insulative layer such that first and second openings expose first and second conductive lines, respectively, said first and second conductive lines comprising a conductive material;
e) forming a recessed conductive material in said first opening and forming a non-recessed conductive material in said second opening thereby by forming a recessed conductive plug and a non-recessed conductive plug;
f) forming a patterned gate insulative layer overlying and conforming to said recessed conductive plug, said patterned gate insulative layer having openings to expose said non-recessed conductive plug;
g) forming a patterned semiconductive film overlying and conforming to said patterned gate insulating layer and said conductive plugs;
h) introducing first conductive impurities into said semiconductive film at an angle to form a TFT source/drain region in the substantially vertical walls of said semiconductive film at said recessed conductive plug and to form a TFT channel region in the substantially horizontal portion of said semiconductive film that overlies said recessed conductive plug, said recessed conductive plug functioning as a TFT control gate; and i) introducing second conductive impurities into said semiconductive film that extends from said recessed conductive plug and overlies and connects to said non-recessed conductive plug to form a TFT source/drain connection region.

9. The process of claim 8, wherein said angled implant is performed from one direction only.

10. The process of claim 8, wherein said angled implant is performed from two opposing directions.

11. The process of claim 8, wherein said semiconductive film auto-doped from said conductive film.

12. The process of claim 8, wherein said auto-doping is p-type.

13. The process of claim 8, wherein said introducing of first and second conductive impurities are performed at the same time.

14. The process of claim 8, wherein said introducing of first and second conductive impurities further comprises:
performing an angled implant to form lightly doped drain regions in the vertical portions of said semiconductive film;
placing a protective layer of resist over said TFT gate region and exposing the remaining portions of said semiconductive film; and
performing an implant to form TFT source/drain regions on said exposed portions of said semiconductive film.

15. The process of claim 8, wherein said introducing of first and second conductive impurities further comprises:
performing an angled implant for only one direction to form a lightly doped drain region on a first vertical portion of said semiconductive film and forming a drain offset region on the opposing second vertical portion of said semiconductive film.

16. A thin film transistor (TFT) fabricated on a supporting substrate, said TFT comprising:
a) a recessed conductive plug serving as a control gate;
b) a control gate insulating layer;
c) a film of semiconductive material connecting to and overlapping said recessed plug, said film having vertical regions extending above said recessed plug and horizontal regions extending over said recessed plug;
wherein, said vertical regions above said recessed plug are conductively doped to form TFT source/drain regions and the horizontal region spanning between said vertical regions above said recessed plug is conductively doped to form a TFT channel region and the horizontal regions outside said recessed plug are conductively doped to form a TFT source/drain interconnect.

17. The thin film transistor (TFT) of claim 16, wherein said supporting substrate comprises a silicon wafer.

18. The thin film transistor (TFT) of claim 16, wherein said recessed conductive plug comprises conductively doped polysilicon.

19. The thin film transistor (TFT) of claim 16, wherein said semiconductive material comprises conductively doped polysilicon.

20. The thin film transistor (TFT) of claim 19, wherein said conductively doped polysilicon comprises p-type conductive doping.

21. The thin film transistor (TFT) of claim 16, wherein said horizontal regions of said semiconductive material at said recessed plug comprises polysilicon conductively doped as n-type.

22. The thin film transistor (TFT) of claim 16, wherein said semiconductive material of said horizontal regions outside said recessed plug comprises polysilicon conductively doped as p-type.

23. A thin film transistor (TFT) fabricated on a supporting substrate, said TFT comprising:
   a) a first recessed conductive plug serving as a control gate;
   b) a control gate insulating layer;
   c) a second recessed conductive plug serving as a source/drain region interconnect;
   d) a film of semiconductive material connecting to and overlapping said first and second recessed plugs, said film having vertical regions extending above said recessed plugs and horizontal regions extending over said recessed plugs;
   wherein, said vertical regions above said first recessed plug are conductively doped to form TFT source/drain regions and the horizontal region spanning between said vertical regions above said first recessed plug is conductively doped to form a TFT channel region, said vertical regions above said second recessed plug are conductively doped to form TFT source/drain resistive regions and the horizontal region spanning between said vertical regions above said second recessed plug is conductively doped to form a TFT source/drain interconnect.

24. The thin film transistor (TFT) of claim 23, wherein said supporting substrate comprises a silicon wafer.

25. The thin film transistor (TFT) of claim 23, wherein said first and second recessed conductive plugs comprise conductively doped polysilicon.

26. The thin film transistor (TFT) of claim 23, wherein said semiconductive material comprises conductively doped polysilicon.

27. The thin film transistor (TFT) of claim 26, wherein said conductively doped polysilicon comprises p-type conductive doping.

28. The thin film transistor (TFT) of claim 23, wherein said horizontal regions of said semiconductive material at said first recessed plug comprises polysilicon conductively doped as n-type.

29. The thin film transistor (TFT) of claim 23, wherein said horizontal regions of said semiconductive material connecting to said first and second recessed plugs comprises polysilicon conductively doped as p-type.

30. A thin film transistor (TFT) fabricated on a supporting substrate, said TFT comprising:
   a) a recessed conductive plug serving as a control gate;
   b) a control gate insulating layer;
   c) a non-recessed conductive plug serving as a source/drain region interconnect;
   d) a film of semiconductive material connecting to and overlapping said plugs, said film having vertical regions extending above said recessed plug and horizontal regions extending over said recessed and non-recessed plugs;
   wherein, said vertical regions above said recessed plug are conductively doped to form TFT source/drain regions and the horizontal region spanning between said vertical regions above said recessed plug is conductively doped to form a TFT channel region, said horizontal region above said non-recessed plug is conductively doped to form a TFT source/drain interconnect.

31. The thin film transistor (TFT) of claim 30, wherein said supporting substrate comprises a silicon wafer.

32. The thin film transistor (TFT) of claim 30, wherein said recessed and non-recessed conductive plugs comprise conductively doped polysilicon.

33. The thin film transistor (TFT) of claim 32, wherein said conductively doped polysilicon comprises p-type conductive doping.

34. The thin film transistor (TFT) of claim 30, wherein said semiconductive material comprises conductively doped polysilicon.

35. The thin film transistor (TFT) of claim 30, wherein said horizontal regions of said semiconductive material at said first recessed plug comprises polysilicon conductively doped as n-type.

36. The thin film transistor (TFT) of claim 3, wherein said horizontal regions of said semiconductive material connecting to said first and second recessed plugs comprises polysilicon conductively doped as p-type.

* * * * *

UNITED STATES PATENT AND TRADEMARK OFFICE
CERTIFICATE OF CORRECTION

Patent No.: 5,334,862

Dated: August 2, 1994

Inventor(s): Monte Manning, Charles H. Dennison

It is certified that error appears in the above-mentioned patent and that said Letters Patent is hereby corrected as shown below:

Column 1, line 1, please insert:

-- This invention was made with Government support under Contract No. MDA972-92-C-0054 awarded by Advanced Research Projects Agency (ARPA). The Government has certain rights in this invention. --

Signed and Sealed this

Ninth Day of May, 1995

Attest:

BRUCE LEHMAN

*Attesting Officer*     *Commissioner of Patents and Trademarks*